United States Patent [19]

Kubota

[11] 4,145,120
[45] Mar. 20, 1979

[54] ELECTRONIC TABLE CALCULATOR USING LIQUID CRYSTAL DISPLAY

[75] Inventor: Kanemitsu Kubota, Suwa, Japan

[73] Assignee: Kabushiki Kaisha Suwa Seikosha, Tokyo, Japan

[21] Appl. No.: 724,127

[30] Foreign Application Priority Data

Sep. 19, 1975 [JP] Japan .................. 50-113264

[22] Filed: Sep. 17, 1976

[51] Int. Cl.² .................................... G02F 1/13
[52] U.S. Cl. ................................ 350/332; 361/404; 361/411
[58] Field of Search ............. 361/411, 404, 412, 398; 350/160 LC; 58/50 R

[56] References Cited

U.S. PATENT DOCUMENTS

| | | | |
|---|---|---|---|
| 3,928,658 | 12/1975 | van Boxtel et al. | 350/160 LC |
| 3,966,302 | 6/1976 | Mikoda et al. | 350/160 LC |
| 4,008,564 | 2/1977 | Luce et al. | 58/50 R |
| 4,013,344 | 3/1977 | Bescond | 339/17 M |
| 4,019,178 | 4/1977 | Hashimoto et al. | 350/160 LC |
| 4,025,162 | 5/1977 | Yagi | 350/160 LC |
| 4,026,103 | 5/1977 | Ichikawa et al. | 350/160 LC |
| 4,074,118 | 2/1978 | Washizuka et al. | 361/380 |

*Primary Examiner*—David Smith, Jr.
*Attorney, Agent, or Firm*—Blum, Moscovitz, Friedman & Kaplan

[57] ABSTRACT

An electronic table calculator is provided having a liquid crystal display and an integrated circuit element defining one or more of the display-driving circuitry or the calculating circuitry thereof. The liquid crystal display is defined by a pair of spaced plates having liquid crystal material therebetween contained by a spacer. At least one of the plates projects beyond the spacer and has formed on the same inner surface thereof, electrode portions within the spacer forming a part of the liquid crystal display and electrode portions outside of the spacer to which the integrated circuit element is coupled by face-down bonding.

6 Claims, 5 Drawing Figures

ELECTRONIC TABLE CALCULATOR USING LIQUID CRYSTAL DISPLAY

BACKGROUND OF THE INVENTION

This invention relates generally to compact electronic table calculators characterized by low power consumption, although the principles of the invention herein may be applied to other electronic devices incorporating liquid crystal displays and integrated circuit chips. The electronic table or pocket calculator has been widely distributed in recent years to individual consumers. For this purpose, it has proved necessary to provide an electronic table calculator which is portable and which can be driven by battery over a long period of time. For the mass consumer market, it is necessary that the electronic table calculator be miniaturized, lightened and reduced in cost.

An electronic table calculator generally consists of at least a calculating circuit, a display-driving circuit operatively coupled to the calculating circuit for driving thereby, a display element for providing a visual digital display of the output of the calculating circuit and operatively coupled to the display-driving circuit for driving thereby, a keyboard or other input arrangement operatively coupled to the calculating circuit, a power source such as a battery, and a case for supporting and protecting the other elements.

It has been found that by using a complementary coupled metal oxide semiconductor (C-MOS) device for the circuit elements and a liquid crystal-type display device, a device having minimum power consumption is produced thereby providing a calculator providing maximum battery life. Further a unique arrangement for coupling the integrated circuit chip to the liquid crystal display device has been provided in furtherance of the goals of miniaturization, reduction in weight and reduction of cost.

SUMMARY OF THE INVENTION

Generally speaking, in accordance with the invention, an electronic device is provided having liquid crystal display means and an integrated circuit means, wherein said liquid crystal display means is formed from a pair of spaced plates, liquid crystal material, a spacer surrounding said liquid crysyal material and first and second electrode means each respectively positioned on one of the spaced facing surfaces of each of said plates within at least the region defined by said spacer, at least the one of said plates bearing said second electrode means extending laterally beyond said spacer. Said one plate has third electrode means formed thereon on the same surface as said second electrode means. Said integrated circuit means is formed with a plurality of contacts on a surface thereof, said integrated circuit means being electrically connected to said third electrode means by face-down bonding of said contacts thereto. Said integrated circuit may be C-MOS. Said face-down bonding may be achieved through the use of solder. The electronic device may be a portable electronic calculator.

Accordingly, an object of the invention is to provide an electronic device having a liquid crystal display and an integrated circuit chip wherein the integrated circuit chip is mounted on an inner face of a plate of the liquid crystal display by means of face-down bonding.

A further object of the invention is to provide an electronic pocket calculator wherein miniaturization and cost reduction is enhanced through the avoidance of lead contact between the liquid crystal display and the integrated circuit elements thereof through the use of face-down bonding.

Still other objects and advantages of the invention will in part be obvious and will in part be apparent from the specification and drawings.

The invention accordingly comprises the features of construction, combinations of elements, and arrangement of parts whic' will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRPTION OF THE PREFERRED EMBODIMENTS

Various kinds of metal oxide semiconductors (MOS) and large scale integrated circuits (LSI) may be used at the present time as a calculating circuit and/or as a display-driving circuit for an electronic calculator. The following table illustrates the power consumption and the required supply voltage of MOS and LSI for various kinds of electronic calculators:

|  | supply voltage (V) | power consumption (mW) |
| --- | --- | --- |
| Al gate E/E MOS | 16 or 8 | 150 |
| Si gate E/D MOS | 6 | 25 |
| COS - MOS | 3~6 | 0.3~2 |

The foregoing table illustrates that a circuit using complementary symmetry-metal oxide semiconductor integrated circuits (COS-MOS-IC) is best adapted for electronic calculators in view of the voltage required in the voltage supply (usually a battery) and the minimum power consumption.

Display devices for electronic calculators may likewise take a number of forms such as digitron, light emitting diodes (LED) and liquid crystal displays. The following table illustrates the driving voltage and power consumption of such forms of display devices:

|  | driving voltage (V) | power consumption (mW) |
| --- | --- | --- |
| digitron | 24 | 100 |
| light-emitting diode | 3~5 | 80 |
| liquid crystal display | 3 | 0.01 |

| | driving voltage (V) | power consumption (mW) |
|---|---|---|
| (field-effect type) | | |

From the foregoing, it is apparent that a display based on liquid crystals is the most advantageous form of display in view of the low voltage required and the low power consumption.

Figure 1:
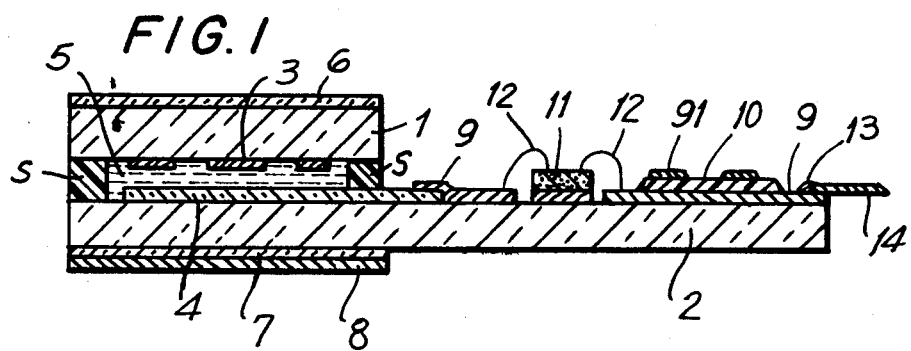
FIG. 1 is a sectional view of the liquid crystal display and associated circuitry of an electronic pocket calculator showing wire bonding.

Referring now to FIG. 1, one method for combining a liquid crystal display with a C-MOS-IC chip is depicted. The liquid crystal display depicted comprises an upper plate 1 and a lower plate 2 both formed of a transparent material such as glass and maintained in spaced relation by a spacer S which also serves to retain liquid crystal material 5 between the plates. As is illustrated in FIG. 1, plate 2 extends laterally beyond the spacer S on at least one side thereof so as to define a support for other electronic circuitry related to the liquid crystal display. Mounted on the inner surfaces of plates 1 and 2 are first electrodes 3 and second electrodes 4 which, together, define the indicia such as numerals to be displayed. The selective application of voltages between selected of electrodes 3 and 4 orients the liquid crystals to render the region therebetween visually distinguishable from the surrounding regions of the liquid crystal. The first and second electrodes are positioned in a pattern to produce the desired indicia. The liquid crystal display device also includes upper polarizing plate 6 and lower polarizing plate 7 mounted respectively on the outer surfaces of plates 1 and 2 and a reflector 8 mounted on the outer surface of lower polarizing plate 7 to complete the optical path. First and second electrodes 4 may be thin film films and, in any event, each segment of electrode 4 to be energized has a portion which extends intermediate spacer S and the surface of lower plate 2 to a region outside of the region defined by spacer S to permit electrical connection to each of said segments. Electrical connecting means can be provided for electrically connecting each of the segments of first electrodes 3 to segments of second electrodes 4 provided for this purpose, which segments would likewise extend outside of spacer S to provide electrical connection to segments of first electrodes 3. Thick film third electrodes 9 are deposited in a pattern on the upper surface of lower plate 2, at least some of the segments of third electrodes 9 making electrical connection with the portions of the segments of second electrodes 4 extending outside of spacer S. A thick film insulator layer 10 is disposed in a predetermined pattern on a portion of third electrodes 9 and thick film fourth electrodes 91 are deposited on the surface of insulating film 10. Crossover interconnection between fourth electrodes 91 and third electrodes 9 is provided in a conventional manner through the means of apertures in insulating film 10 and the provision of conductors in said apertures.

A COS-MOS-IC chip 11 including circuitry for performing both calculating functions and display-driving functions is mounted on the upper surface of lower plate 2. Electrical connection between third electrodes 9 and the contacts of the chip 11 is by way of wire-bonding 12. A terminal portion 14 for connection of the assembly to other circuitry, such as a keyboard or a source of electrical power is provided. Terminal 14 is coupled to one of the thick film third electrodes 9 by means of solder 13.

Figure 2:
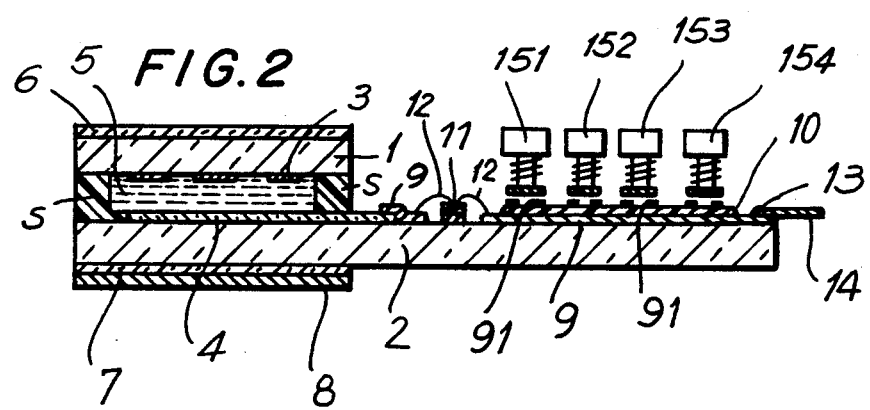
FIG. 2 is still another sectional view of a liquid crystal display and associated circuitry of an electronic calculator showing wire bonding and a keyboard arrangement.

FIG. 2 illustrates a structure similar to that of FIG. 1, like reference numerals being applied to like elements. However, in the embodiment of FIG. 2, the thick film fourth electrodes 91 define a pattern suitable for forming a keyboard contact. Above the fourth electrodes and positioned for making selective electrical contact with respective segments thereof are keys 151, 152, 153 and 154. This approach minimizes exterior soldering and leads to more effective production, miniaturization, reduction in weight and thinning of electronic calculators.

In both FIGS. 1 and 2, a C-MOS-IC chip is bonded to thick film conductors by a wire-bonding technique, the thick-film conductors being provided on the liquid crystal base plate. However, it is desirable to form most of the circuitry of an electronic calculator in a single integrated circuit chip including the calculating circuitry, circuitry for generating the clock signal and the liquid crystal driver circuitry. This approach results in reduced cost and improved reliability but since the number of bonding pads or contacts on such a C-MOS-IC may be 36 or more, the number of process steps required for assembly increases where the wire-bonding method is utilized. Further, wire-bonding machines are fairly expensive and the production capability of a single machine is relatively small. Accordingly, mass production of electronic devices such as electronic calculators results in increased equipment cost which counteract the beneficial effects of using a single integrated circuit chip. By utilizing an improved face-down bonding method as the method of joining a C-MOS integrated circuit to a liquid crystal display cell, the foregoing difficulties are avoided.

Figure 3:
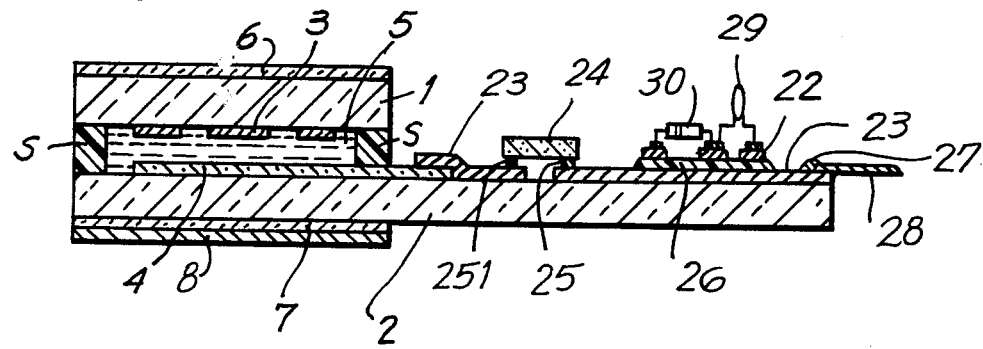
FIG. 3 is a sectional view of a liquid crystal display and associated circuitry in accordance with the invention depicting face-down bonding of an integrated circuit element.

Referring to FIG. 3, the liquid crystal display cell structure is similar to that of FIGS. 1 and 2 and like reference numerals are applied to like elements. In this embodiment, thick film third electrodes 23 are applied to the inner surface of lower plate 2, at least portions of said third electrodes being in electrical connection with segments of second electrodes 4. As in the case of FIGS. 1 and 2, first electrodes 3 and second electrodes 4 may be formed of transparent conductive films such as tin oxide and indium oxide. If desired, third conductors 23 may be formed of a thin film and may be formed by evaporation, plating or the like. An LSI chip 24 consisting of a one-chip CPU including one or both of the liquid crystal driving circuitry and calculating circuitry is secured to the third conductors 23 by a face-down bonding technique. An insulating layer 26 is provided on third electrodes 26 formed of a dielectric thick film or a thin insulating film and a pattern of fourth electrodes 22 may be deposited on insulating film 26 as described above and interconnected with third electrodes 23 in the manner described above in connection with FIG. 2. A capacitor 29 and a resistor 30 are coupled to fourth electrodes 22 and define a portion of the circuit for generating the clock pulse of the LSI chip or define a part of the circuit for automatic clearing of the calculating circuitry. Said resistor and capacitor are preferably secured to fourth conductors 22, which may be thick film or thin film electrodes, by means of resistance welding. If desired, the resistance and capacitor devices can be formed utilizing integrated circuit techniques directly on the electrode base plate 2 by means of thick or thin films. The assembly is provided with an external terminal 28 for connection to external parts such as a keyboard or a power source (battery), terminal 28 taking the form of a flexible print wiring base plate, an electric lead wire or the like. Said terminal is electrically connected to the third electrodes 23 by means of solder or resistance welded portion 27.

Figure 4:
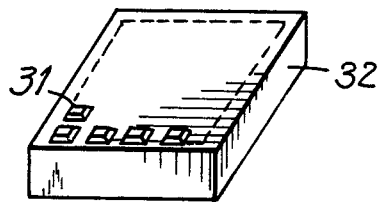
FIG. 4 is a bottom perspective view of an integrated circuit element depicting the contacts thereof.

The LSI chip is bonded by face-down bonding through bonding portions 25 and 251. Face-down bonding may be achieved by means of the following procedure where the pattern of third electrodes 23 is formed to provide terminal pads corresponding in orientation to the terminal pads or contacts of the LSI chip. First, thin films of gold, nickel, copper or the like are formed on the bonding pad portion of the LSI chip 24 by means of evaporation or in the form of solder. Corresponding thin films of similar materials are deposited on the bonding pad regions of third electrodes 23. Thereafter, the LSI chip 24 is thermobonded to the third electrodes 23 through the joining of the deposited thin films. FIG. 4 illustrates an LSI chip 32 which has been solder plated in the region of contacts 31.

Third electrodes 23, if in thick-film form, may be formed of silver or silver-palladium. If such materials are used, the efficacy of the soldering is further improved if a gold paste is utilized. Where the third electrodes are formed of a thin film, solders formed of nickel, copper, gold, iron or an alloy including them improve soldering. Reliability is further improved by applying solder-plating to the contact terminal portions of the segments of third electrodes 23.

A second method of face-down bonding is by applying pressure on the LSI chip 24 to engage the chip against third conductors 23 after placing an annealed metal of indium, tin, lead or the like on the bonding pad or contact portions of the LSI chip 24 by way of vapor deposit, soldering or the like. As in the prior method, the bonding power is improved if the annealed metal of indium, tin or lead or the like is likewise deposited on the bonding portion of third electrodes 23.

A third method is the application of gold or an alloy including gold in a somewhat thick layer to the bonding pad or contact portion of the LSI chip by vapor deposit, plating or the like. Bonding is achieved by applying pressure to the conductive wiring portion. In this case, as in the other cases, bonding is improved if the gold or an alloy including gold is applied to the bonding portion of the third electrodes. The bonding of the gold film to the contacts of the LSI 24 and to the conductive electrodes is enhanced if a layer of aluminum, chromium, nickel, copper or an alloy including them is applied before the gold is applied.

A fourth method for achieving face-down bonding is by subjecting the bonding agent to calcination by heat after deposit on the bonding pad portion of the LSI chip 24 or on the bonding pad portion of the third electrodes.

Figure 5:
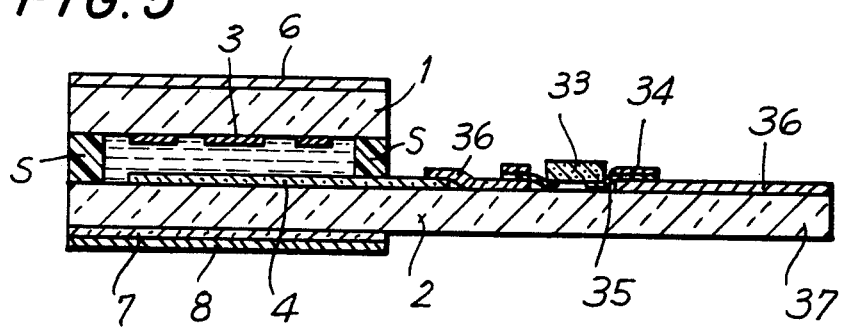
FIG. 5 is a sectional view of still another liquid crystal display cell and associated circuitry depicting still another embodiment of face-down bonding in accordance with the invention.

A fifth method of face-down mounting of an LSI chip is illustrated in FIG. 5, where like reference numerals are applied to like elements. In this method, the LSI chip is bonded by supersonic waves or heat-pressure to an array of thin film electrodes 35 arranged to correspond to the contacts of the chip and supported on an insulating film 34 such as a film formed of a polyimide or like insulator. This first bonding is followed by bonding the other end of each electrode 35 to the third electrodes 36 disposed on the liquid crystal lower base plate 2 by means of solder or electric welding. The arrangement in accordance with the invention wherein a liquid crystal panel is utilized as a display for an electronic calculator, a C-MOS-LSI is utilized as an integrated circuit for performing the calculating function and/or the display driving function, and said integrated circuit chip is mounted on one of the base plates of the liquid crystal by face-down bonding, provides the following advantages:

a. a display device and the calculating circuit portion can be united in compact and thin assembly.
b. the number of bonding processes is reduced and bonding machinery is decreased through utilization of the face-down bonding technique.
c. since the strength of the bond is greater where face-down techniques are utilized, reliability is further improved.

While the embodiments depicted utilize a liquid crystal display cell of a particular configuration incorporating polarizens and a reflector, other liquid crystal display cell configurations can be used in accordance with the invention. Similarly, the arrangement in accordance with the invention can be utilized in connection with other electronic devices incorporating liquid crystal display cells and integrated circuit elements.

It will thus be seen that the objects set forth above, and those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An electronic device incorporating a liquid crystal display cell and an integrated circuit chip in the form of a C-MOS-IC associated with said display cell and electrically connected therewith comprising a liquid crystal display cell formed from a pair of spaced plates; a liquid crystal material intermediate said plates; a spacer positioned intermediate said plates and surrounding said liquid crystal material, one of said plates extending laterally beyond said spacer; first and second electrodes respectively positioned on facing surfaces of said plates, said second electrodes positioned on the surface of said one plate including regions extending along the surface of said one plate past said spacer to the region of said one plate extending laterally beyond said spacer; third thin film electrodes formed on the same surface of said one plate as said second electrodes in the region thereof extending laterally from said spacer, at least a portion of said third electrodes being in electrical connection with said second electrodes and at least a portion of said third electrodes terminating in contact regions, said integrated circuit chip being electrically connected to said contact regions by face-down bonding, said integrated circuit chip having a surface and including contacts formed on said surface in a predetermined array, said contact regions of said third electrodes being formed in an array corresponding to the contacts of said integrated circuit chip for registration therewith; and further including a layer, formed of a material chosen from the group including gold, nickel and copper, formed on each said contact of said integrated circuit chip and each said contact region of said third electrodes, said contacts and contact regions being joined by thermobonding through the use of solder, said solder being selected from the group of materials including nickel, copper, gold, iron, or an alloy including them.

2. The electronic device as recited in claim 1, wherein said electronic device is incorporated in an electronic calculator.

3. The electronic device as recited in claim 1, wherein a layer of said solder is applied to both said contacts and said contact regions before face-down bonding.

4. An electronic device incorporating a liquid crystal display cell and an integrated circuit chip associated with said display cell and electrically connected therewith comprising a liquid crystal display cell formed from a pair of spaced plates; a liquid crystal material intermediate said plates; a spacer positioned intermediate said plates and surrounding said liquid crystal material, one of said plates extending laterally beyond said spacer; first and second electrodes respectively positioned on facing surfaces of said plates, said second electrodes positioned on the surface of said one plate including regions extending along the surface of said one plate past said spacer to the region of said one plate extending laterally beyond said spacer; third electrodes formed on the same surface of said one plate as said second electrodes in the region thereof of extending laterally from said spacer, at least a portion of said third electrodes being in electrical connection with said second electrodes and at least a portion of said third electrodes terminating in contact regions, said integrated circuit chip being electrically connected to said contact regions by face-down bonding, said integrated circuit chip having a surface and including contacts formed on said surface in a predetermined array, said contact regions of said third electrodes being formed in an array corresponding to the contacts of said integrated circuit chip for registration therewith and further including a layer of an annealed metal material selected from the group including annealed indium, annealed tin, and annealed lead applied to the contacts of said integrated circuit chip and to the contact regions of said third electrodes face-down bonding being achieved by pressure.

5. An electronic device incorporating a liquid crystal display cell and an integrated circuit chip associated with said display cell and electrically connected therewith comprising a liquid crystal display cell formed from a pair of spaced plates; a liquid crystal material intermediate said plates; a spacer positioned intermediate said plates and surrounding said liquid crystal material; one of said plates extending laterally beyond said spacer; first and second electrodes respectively positioned on facing surfaces of said plates, said second electrodes positioned on the surface of said one plate including regions extending along the surface of said one plate past said spacer to the region of said one plate extending laterally beyond said spacer; third electrodes formed on the same surface of said one plate as said second electrodes in the region thereof extending laterally from said spacer, at least a portion of said third electrodes being in electrical connection with said second electrodes and at least a portion of said third electrodes terminating in contact regions, said integrated circuit chip being electrically connected to said contact regions by face-down bonding, said integrated circuit chip including a surface and a purality of contacts formed on said surface in a first array; said contact regions of said third electrodes being arranged in a second predetermined array; and including a coupling element including an insulating carrier and an array of fourth electrodes each having a first contact region and a second contact region, said first contact regions being aligned for registration with said contact of said integrated circuit chip and being joined thereto, said second contact regions being aligned with said contact regions of said third electrodes and being joined thereto to effect electrical connection between said contact regions of said third electrodes and said contacts of said integrated circuit chip.

6. The electronic device as recited in claim 5, wherein said first contact regions are the product of joining said contacts by a method selected from the group including supersonic waves and heat-pressure.

* * * * *